United States Patent

Hayes

[15] 3,668,990

[45] June 13, 1972

[54] PRINTED CIRCUIT GENERATOR

[72] Inventor: Lawrence P. Hayes, Johnson City, N.Y.

[73] Assignee: International Business Machines Corporation, Armonk, N.Y.

[22] Filed: Dec. 10, 1969

[21] Appl. No.: 883,715

[52] U.S. Cl. ....................................95/12, 350/271, 355/2

[51] Int. Cl. ....................................G03b 29/00

[58] Field of Search ..................95/12, 55, 56; 355/101, 102, 355/109, 121, 71, 124, 2; 350/266, 271, 272; 353/97

[56] References Cited

UNITED STATES PATENTS

| | | | |
|---|---|---|---|
| 2,672,799 | 3/1954 | Terwilliger | 350/271 X |
| 3,365,714 | 1/1968 | Timares et al. | 350/272 X |
| 2,929,871 | 3/1960 | Cross | 350/266 X |
| 2,334,329 | 11/1943 | Isaacson | 350/271 X |
| 3,103,849 | 9/1963 | Wise | 350/271 X |
| 3,489,485 | 1/1970 | Marcovecchio et al. | 350/271 |
| 3,008,372 | 11/1961 | Willey et al. | 95/12 |

*Primary Examiner*—Samuel S. Matthews
*Assistant Examiner*—Robert P. Greiner
*Attorney*—Hanifin and Jancin and Kenneth P. Johnson

[57] ABSTRACT

Apparatus for exposing incrementally variable length lines on a photosensitive surface primarily adapted to form printed circuits. An elongated slit for passing light is covered by a plurality of independently operable gates, each controlling light emission from a unique portion of the slit. Emitted light is then controlled by a shutter-lens complex to impinge on the sensitized surface of a workpiece which can be indexed and rotated for exposure of both orthogonal and non-orthogonal lines.

7 Claims, 4 Drawing Figures

INVENTOR
LAWRENCE P. HAYES
BY Kenneth P. Johnson
ATTORNEY

PRINTED CIRCUIT GENERATOR

BACKGROUND OF THE INVENTION

The production of photographic masters for the exposure of photosensitive resist during the manufacture of printed circuits is both time-consuming and expensive. During production of the master plates the photographic emulsion or resist must be carefully exposed to obtain accurate pattern reproduction and uniform exposure. Inadvertent transparency or opacity causes subsequent rejection of the circuit substrates because of voids or short circuiting links. Photographic masters have a relatively short life when used in contact exposure since they are subject to abrasion, and because of replacement due to circuit changes in the pattern.

Heretofore the generation of new or replacement masters has usually been done by scanning one or more closely directed light beams over the sensitized master while simultaneously turning the beams on and off to serially produce the line segments desired. This can also be changed to move the sensitized master relative to the light. Such serial operation in exposing segments is very slow. Other methods are to lay out the pattern by hand or with a plotter in an enlargement and then use photographic reductions as a mask during exposure.

One method advanced for the production of photographic masters is the provision of a linear array of individual lamps which are arranged to emit light through a reducing lens onto the photosensitive surface of the master. The lamp sources are independently turned on and off to form an illuminated line or segment thereof as required. After exposure, the master is incrementally advanced to a new position and the sources again selectively illuminated. By progressive advance of the master and coordinated illumination, lines running in the same direction can be rapidly exposed. Upon completion in the one direction, the master is rotated 90° and advanced past the lens again. In this manner lines can be exposed in orthogonal directions, either connected or not.

This apparatus has disadvantages that make it unsuitable for precise work. By using several light sources, a wide variation in emitted energy can be encountered causing an uneven exposure of the photosensitive medium. The use of several sources also decreases reliability because failure of a single source during operation requires repair time and exposure of another master. In addition, no variation is possible in exposure pattern, such as junction and terminal configurations.

Accordingly, a primary object of this invention is to provide apparatus by which variable patterns on a photosensitive surface can be generated more rapidly and economically and with less complex registration.

A further object of this invention is the provision of apparatus for generating circuit patterns on photosensitive mediums with improved reliability and repeatability that is readily suitable for applications on varying field sizes and grids.

Another object of this invention is to provide apparatus for exposing photosensitive mediums which uses a single energy source with gating devices enabling exposure of variable length line segments with more uniform intensity.

SUMMARY OF THE INVENTION

The foregoing objects are attained in accordance with the invention by providing a single line light source having an adjustable slit covered with a plurality of selectively operable gating devices each effective to block off a unique portion of the light from the photosensitive surface on a workpiece positioned for impingement by the light energy. The apparatus includes a lens and shutter means to permit the preselection of gates for simultaneous exposure of the workpiece to all unblocked areas. An incrementing workholder is synchronized for operation with the shutter.

The single source arrangement has the advantage of reducing the aging problem and producing uniform intensity of light at all segments of the illuminated slit to thereby improve the resolution of circuit lines. The use of an adjustable slit to define the edges of the light beam also enhances versatility. By controlling light emission with gates, the variation in light intensity and duration due to lamp switching is overcome, adding significantly to the uniformity of exposure and reduction of service time. Light source positioning is simplified and the on-off switching of multiple sources is eliminated.

The foregoing and other objects, features and advantages of the invention will be apparent from the following more particular description of a preferred embodiment, as illustrated in the accompanying drawings wherein:

FIG. 1 is a perspective schematic view of a printed circuit generator constructed in accordance with the invention;

FIGS. 2*a* and 2*b* are plan view of the operative positions of light gates shown in FIG. 1; and FIG. 3 is a partial front elevation view of a plurality of light gates of FIG. 1 shown in the blocking position.

DESCRIPTION OF THE PREFERRED EMBODIMENT

Figures 1, 2A, 2B, 3:
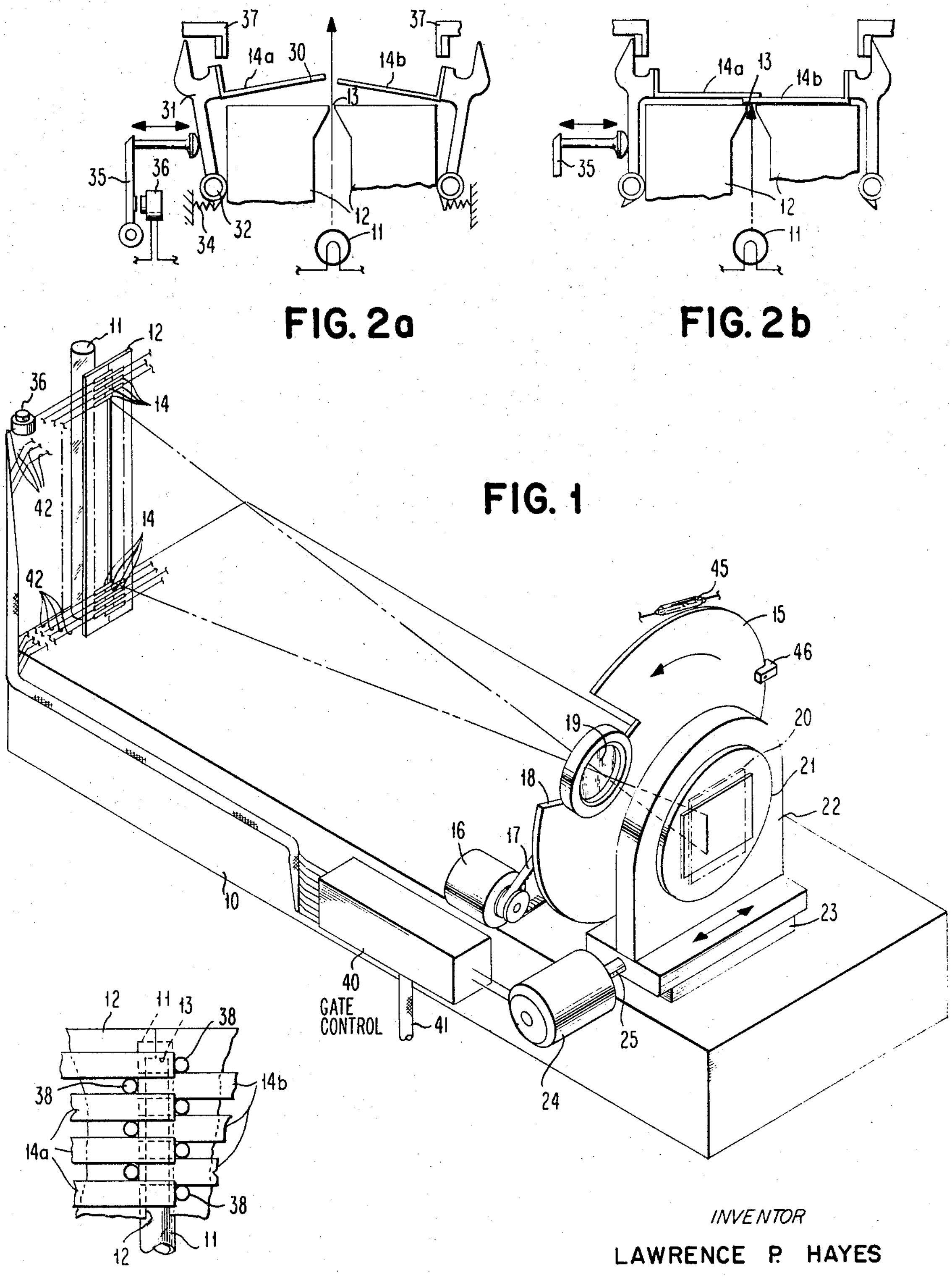

Referring to FIG. 1 a base 10 supports thereon a light source 11, a pair of aperture plates 12 forming an elongate slit 13 limiting the passage of light, and a plurality of movable gates 14, each operable to block or permit the passage of light beyond slit 13.

A shutter disc 15 is supported for rotation on base 10 and driven by motor 16 through belt 17. Disc 15 has a cutout 18 so as to periodically admit light to reducing lens 19 during rotation. Light reaching lens 19 is focused to impinge on the photosensitive surface of workpiece 20 supported in a workholder 21. Workholder 21 is supported for rotation in fixture 22 which is reciprocable in the direction of the arrows on a base plate 23 by a conventional reversible stepping motor 24 through drive screw 25.

For generating printed circuit configurations, the workpiece is usually a glass base having a thin metallic coating on one side which is covered with a photographic emulsion or photosensitive resist. Examples of resist are KPR by Eastman Kodak Co. and Riston by E. I. Du Pont de Nemours Co. Photoresists are generally sensitive to radiation of the shorter wave lengths such as ultraviolet range. Light source 11 should therefore provide the most efficient wave length. It has been found that a fluorescent tube designed to emit in the ultraviolet range serves as a satisfactory source for photosensitive emulsions. Detailed mounting supports and energy supply for the light are believed well-known in the art and unnecessary in the drawing.

Aperture plates 12 which form slit 13 are preferably made adjustable to produce varying line widths on the workpiece. The edges of the plates should also be straight and smoothly finished to produce good line edge definition during exposure.

Light gates 14 have been shown only schematically and partially in FIG. 1 and may be of any suitable design that fully exposes the slit segments when open and prevents light leakage when closed. One satisfactory gating arrangement is shown in more detail in FIGS. 2*a*, 2*b* and 3. In FIG. 2*a*, gates **14*a* and 14*b* are shown in the normally open or retracted position allowing light from source 11 to pass through slit 13 between plates 12. The gates may comprise a shield portion 30 affixed to a base portion 31 which is rotatable on pivot 32. The gates are urged toward the open position by spring 34 and are moved to the closed position by the movement produced in armature 35 when electromagnet 36** is energized, as in FIG. 2*b*. Stops 37 limit the movement of the actuated gates. To enable closer spacing adjacent gates are mounted on opposite sides of slit 13. In addition, the lengths of adjacent armatures can be varied to permit staggered mounting of the electromagnets on a side.

To prevent the passage of extraneous light, the shield portions 30 are made slightly larger than their respective slit segment to be controlled. This arrangement produces an overlap of gates as shown more clearly in FIG. 3. During set-up operation of the gates, those underneath in FIGS. 2*A* AND 2*B* are controlled to close slightly ahead of the others to avoid interference. If desired, guide pins 38 may be placed between adjacent gates on each side of the slit.

The control of electromagnet operation for the light gate can be with individual switches or with a control device such as a computer. The circuits are shown schematically in FIG. 1 as a Gate Control unit 40 to which a computer input is made along cable 41. Gate electromagnets such as 36 are energized by pulses on their respective control lines 42. Gate Control unit 40 can also be used to synchronize the operation of shutter motor 16 and workpiece stepping motor 24. The rotation of shutter disc 15 is preferably used to produce a synchronizing signal to the Gate Control unit 40 immediately after cutout 18 has passed lens 19. This timing procedure provides the maximum time in which to supply control signals to the light gates and stepping motor for accomplishing the required gate setup and workpiece advance. One method by which a synchronizing signal is obtained is to actuate a reed switch 45 with a magnet 46 or with mechanical contact by disc 15. Closure of switch 45 will initiate the several circuit actuations in Gate Control unit 40 to change the gated portions of the slit and advance an unexposed part of the workpiece surface into position.

In operation of the printed circuit generator, a workpiece 20 is secured on workholder 21 and the supporting fixture 22 is retracted to a starting position with shutter 15 blocking lens 19. Selected light gates are de-energized allowing the gates to open and permit light to pass to the shutter. The remaining light gates remain energized to block light emission. Light gates are operated singly or in any combination to produce vertical segments of light in alignment that can have incrementally variable length ranging up to the entire length of slit 13. Shutter motor 16 is then energized to expose lens 19 and hence, the photosensitive surface of workpiece 20 to the aligned segments of the light line. After cutout 18 passes lens 19, magnet 46 energizes switch 45 and signals are again generated at unit 40 to advance the workpiece and repeat or produce a new configuration of light segments for exposure with gates 14.

After workpiece 20 reaches its limit, its holder 21 is rotated 90° in fixture 22 for the exposure of lines running in a direction orthogonal to those just exposed. These latter lines may connect with those formed earlier or be independent lines on the workpiece. The exposure format is, of course, dependent upon the requirements of the circuit plane.

In the exposure of circuit lines with the apparatus of the invention, the slit segments are centered about an imaginary center line to readily determine the location of line boundaries. Upon the exposure of both X and Y oriented segments that are to be connected with overlapping images, there will be an unexposed notch in the outside corners. This can be overcome by various methods. One method is to shift the lens or workpiece in its holder half the line width after being rotated 90° in preparation for the second exposure pass. After completion of that pass, the lens or workpiece is shifted a full line width to the opposite direction and the line is again exposed or only the required corner segments are exposed. Double exposure is usually not detrimental in the subsequent workpiece processing steps. Another method is to replace or cover the aperture plates with a land or terminal configuration and shift the lens or workpiece the appropriate distance for selective double exposure at the corners. A third alternative is the provision of variable width light gates selectively movable for example, to three positions to change the size of the illuminated segments.

It will be apparent that the exposed lines need not always be in orthogonal directions but that they can be formed at selected angles. When forming the lines at a different angle, for example at 45°, the size of the imaged segments may have to be changed because only a partial segment will be required. This can be resolved by altering the optical conjugates to change the amount of image reduction.

By making plates 11 and 12 adjustable, the desired image line width can be changed to adapt to differing conductor requirements. In addition, the size of the gates can be constructed to produce longer or shorter image segments as needed.

This apparatus allows significant improvement in the uniformity of successive master plates and in the time required to expose them. The gates have little mass and can be moved quickly with little energy. The apparatus is preferably mounted on a heavy base and isolated from vibration for the finer work. The amount of image reduction can, of course, be changed to accommodate a wide range of workpiece sizes.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In apparatus for exposing photosensitive material for printed circuit generation, the combination comprising:
means providing an elongated slit of predetermined length and uniform width for admitting light therethrough from a source;
a plurality of opaque elements overlying said slit adjacent one another along the length of said slit, each being independently movable from one position completely blocking the passage of said light through a preassigned, unique area of said slit determined as a portion of said slit length between two said elements and the entire slit width, to another position for permitting the passage of light through its said entire area; and
selectively energizable power means for selectively moving said elements between said positions singly or in combination to produce one or more uniformly illuminated areas of variable length and uniform width.

2. Apparatus as described in claim 1 further comprising:
a support having photosensitive material thereon and a lens interposed between said support and said elements for producing an image of said exposed slit areas on said material.

3. Apparatus as described in claim 2 further comprising:
shutter means between said lens and said elements for selectively exposing said photosensitive material to said exposed slit areas.

4. Apparatus as described in claim 3 further comprising:
means operable to move said support by predetermined increments normal to the direction of light impingement on said material, and
means for initiating operation of said moving means during the time said shutter prevents exposure of said material.

5. Apparatus as described in claim 3 wherein:
said shutter means includes at least one rotatable opaque disc having a slot therein through which said light passes to said lens.

6. Apparatus as described in claim 1 wherein:
each said movable element is of a size sufficient to block an area greater than its assigned slit area to effect an overlapping of elements and thereby prevent leakage of light therebetween.

7. Apparatus as described in claim 1 wherein:
adjacent ones of said elements are mounted to move in opposite directions between said one and another positions.

* * * * *